United States Patent [19]
Lin et al.

[11] Patent Number: 5,413,940
[45] Date of Patent: May 9, 1995

[54] PROCESS OF TREATING SOG LAYER USING END-POINT DETECTOR FOR OUTGASSING

[75] Inventors: Chung-An Lin; Ting-Hwang Lin; Ying-Chen Chao, all of Hsin-Chu, Taiwan, Prov. of China

[73] Assignee: Taiwan Semiconductor Manufacturing Company, Hsinchu, Taiwan, Prov. of China

[21] Appl. No.: 320,895

[22] Filed: Oct. 11, 1994

[51] Int. Cl.6 ............... H01L 21/316; H01L 21/3213
[52] U.S. Cl. ..................................... 437/7; 437/189; 437/231
[58] Field of Search .............. 437/7, 8, 189, 231, 437/228; 148/DIG. 162; 204/153.22

[56] References Cited

U.S. PATENT DOCUMENTS

| | | | |
|---|---|---|---|
| 4,938,847 | 7/1990 | Andrews, Jr. et al. | 204/153.22 |
| 5,003,062 | 3/1991 | Yen | 437/228 |
| 5,106,787 | 4/1992 | Yen | 437/228 |
| 5,174,043 | 12/1992 | Yen | 437/228 |
| 5,364,818 | 11/1994 | Ouellet | 437/231 |
| 5,372,673 | 12/1994 | Stoger et al. | 156/627 |

FOREIGN PATENT DOCUMENTS 456248  2/1992  Japan ..................... 437/231

*Primary Examiner*—George Fourson
*Assistant Examiner*—Thomas G. Bilodeau
*Attorney, Agent, or Firm*—George O. Saile

[57] ABSTRACT

Disclosed is a method of integrated circuit manufacture involving a method for optimizing the time needed to outgas a layer of spin-on-glass. A layer of spin-on-glass that was previously covered over may be exposed again as a result of subsequent processing. It is necessary to subject such a layer to an outgassing treatment by heating it in vacuum prior to the deposition of a metal film which could react with any ougassed material that was not already removed. To avoid having to heat the integrated circuit for any longer than is absolutely necessary during outgassing, the partial pressure of the outgassed material is monitored by means of a residual gas analyzer whose output is used to control the outgassing process.

20 Claims, 5 Drawing Sheets

PROCESS OF TREATING SOG LAYER USING END-POINT DETECTOR FOR OUTGASSING

BACKGROUND OF THE INVENTION

1. Field of the Invention

This invention relates in general to semiconductor device processing, and more particularly to an effective method for optimizing the process used to outgas a layer of spin-on-glass.

2. Description of the Prior Art

Spin-on-glasses (SOGs) are commonly used in the manufacture of integrated circuits in order to achieve planarization of the surface. As the integrated circuit gets built up, layer by layer, its surface becomes increasingly uneven. This lack of planarity reduces the degree of precision with which each succeeding pattern (into which the most recently deposited layer will be shaped) can be aligned with respect to the pattern that preceded it.

SOGs are useful materials for achieving planarization since they may be applied to a surface in liquid form (i.e. uncured) and then converted to solid form, in situ, through suitable heat treatment (i.e. cured). While in liquid form, the SOG flows into all the depressions in the surface to which it was applied, presenting a planar surface of its own once flow has ceased. The solid material to which it is converted after heat treatment is essentially silicon dioxide which is compatible with the other materials that form the integrated circuit well as being compatible with any subsequent processing steps yet be performed on the integrated circuit.

Once creation of the SOG layer has been completed, manufacture of the integrated circuit continues with the application of additional layers of material. It was observed as part of manufacturing experience that when part of a previously deposited SOG layer was exposed as a result of, for example, etching away adjacent layers that had previously covered the SOG layer, there was a tendency for such exposed SOG surfaces to undergo ougassing under conditions of moderate heating.

For example, if via holes, etched between two levels in the integrated circuit, passed through a layer of SOG, the SOG surfaces exposed inside the via holes could sometimes emit previously trapped moisture while a layer of metal was being deposited onto the inside of the via holes. This emitted moisture reacted with the metal as it was being deposited, resulting in high contact resistance between the freshly deposited metal layer and the surface of a metal layer at the bottom of the via hole.

It has been found that an effective solution to this problem is to briefly heat the integrated circuit in vacuum prior to the deposition of the metallic layer so as to clear the exposed SOG surfaces of moisture. As in all integrated circuit manufacturing procedures, the lower the temperature and the shorter the time for which this degassing procedure could be performed, the better. The problem that had to be solved, therefore, was how to optimize time and temperature for SOG outgassing.

Prior to the development of the present invention, the optimum time and temperature for SOG outgassing were determined by performing a series of experiments and then using the results to set fixed values for these two quantities. From then on, the same time and temperature were used each time SOG degassing was needed. This approach suffers from several disadvantages. First, the amount of outgassing that will occur varies from one sample of SOG to the next. This could be because of variations in the thickness of the SOG or in the moisture retention properties of a given SOG sample. Second, the amount of outgassing associated with even the same sample and thickness of SOG will depend on the prior treatment received by the SOG, factors such as type of etchant used to expose the SOG, duration of etching, time that the exposed SOG was open to the atmosphere, etc., all playing a role.

Accordingly, a method was needed for quantitatively monitoring the outgassing of the SOG while it occurred and then terminating the heat treatment as soon as outgassing had ceased. A method for detecting the presence of water in semiconductor devices has been described by Andrews, Lifshitz, and Smolinsky in U.S. Pat. No. 4,938,847 (July 1990). This method comprises applying high voltage across the region that is to be monitored and then relating the resulting leakage current to the concentration of trapped water molecules. This method is not suitable for dealing with the SOG outgassing problem since the geometries involved (thin layers deep inside via holes) preclude the use of voltage probes. Also, the method measures moisture that has been left behind rather than what was emitted. The purpose of the outgassing heat treatment is to ensure that that no moisture will be present during metal film deposition, not necessarily to drive out all moisture that may be present in the SOG.

It was therefore an object of the present invention to be able to determine precisely when outgassing had ceased and to then use this information to limit the duration of the outgassing process to the minimum that was needed. This has been achieved through use of a residual gas analyzer attached to a control unit, as will be described below.

SUMMARY OF THE INVENTION

A method for optimizing the length of time for which a layer of a spin-on-glass is outgassed is described. The method involves heating the layer of spin-on-glass in vacuum while at the same time measuring the partial pressures of the gases released by the spin-on-glass as a result of the application of heat. The partial pressure measurements are effected using a residual gas analyzer, more particularly a quadrupole mass spectrometer, whose output is used to control the heating process.

A particular application of the invention is for the outgassing of via holes in integrated circuits prior to the application of a metallic layer to the surface, including the surface of a previously deposited metal layer that lies at the bottom of the via hole.

DESCRIPTION OF THE PREFERRED EMBODIMENTS

In general, integrated circuits are built by depositing a series of layers one on top of another. After the deposition of each layer, and prior to the deposition of the next one, the layer is subjected to an etching procedure which shapes it into a pattern of lines and distinct areas. As a result, what started out as a completely planar surface becomes increasingly more irregular as successive layers of material partially cover the surface. Thus, it becomes necessary to include in the process of making an integrated circuit some means for returning the surface to a planar condition. If this is not done, problems soon arise with, for example, the alignment of successive masks that are used to define the patterns into which the different layers will be etched.

One way of achieving planarization is to deposit a layer that is initially in the liquid state. Such a layer will seek its own level rather than contouring the surface onto which it is deposited—as is the case with layers that are deposited directly in solid form. It then remains to convert the liquid layer into a solid one (with properties that are compatible with the intergrated circuit as a whole, including any subsequent manufacturing steps). Assuming the newly created solid layer retains the same surface geometry as the liquid layer from which it derived, planarization of the surface will have been achieved. One class of materials that can start out as liquids and then be converted to suitable solids are spin-on-glasses (SOGs).

Prior to curing, spin-on glasses are liquids which can be applied to the surface of, for example, a semiconductor wafer so as to form a layer of a predetermined thickness. Thickness is controlled by dripping a measured amount onto the surface of a spinning wafer in the same way that photoresist is applied. The liquid is then allowed to dry, much like a coat of paint, following which it is cured by means of a suitable heat treatment. This converts it to a glassy material, mainly $SiO_2$, while other components are driven off as volatile byproducts, such as $H_2O$ and $CO_2$.

Figure 1:
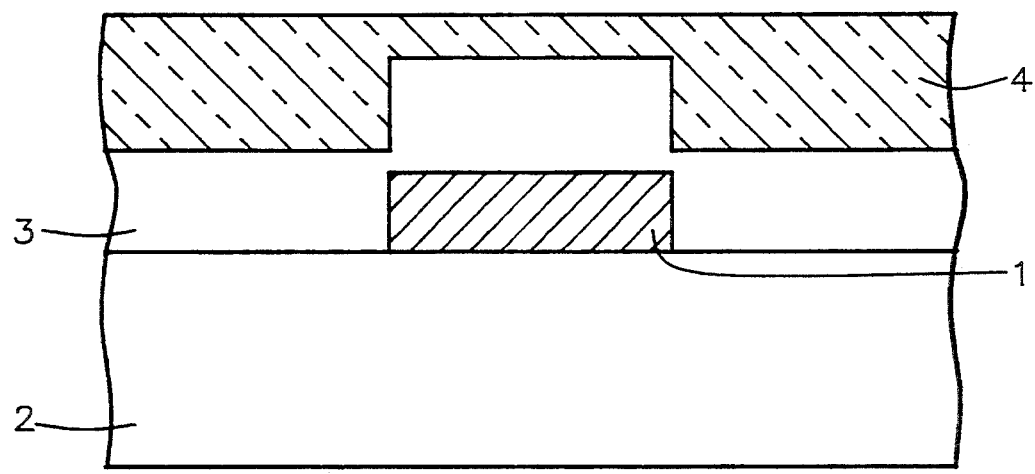
FIG. 1 is a schematic cross-section through a partially completed integrated circuit, illustrating the use of spin-on-glass to achieve planarization.

Referring now to FIG. 1, we show a schematic cross-sectional view through a partially completed integrated circuit. A metal layer 1 has been deposited onto the surface of a silicon body 2 (which has been subjected to prior processing not discussed or shown here) and etched into the shape of a line (shown edge on in the figure). An insulating layer 3 has been deposited over the metal layer, contouring its surface, as shown. A layer of SOG 4 has been deposited over insulating layer 3 returning the surface to a planar condition. Once the SOG layer has been cured it may be etched back to some desired thickness.

Figure 2:
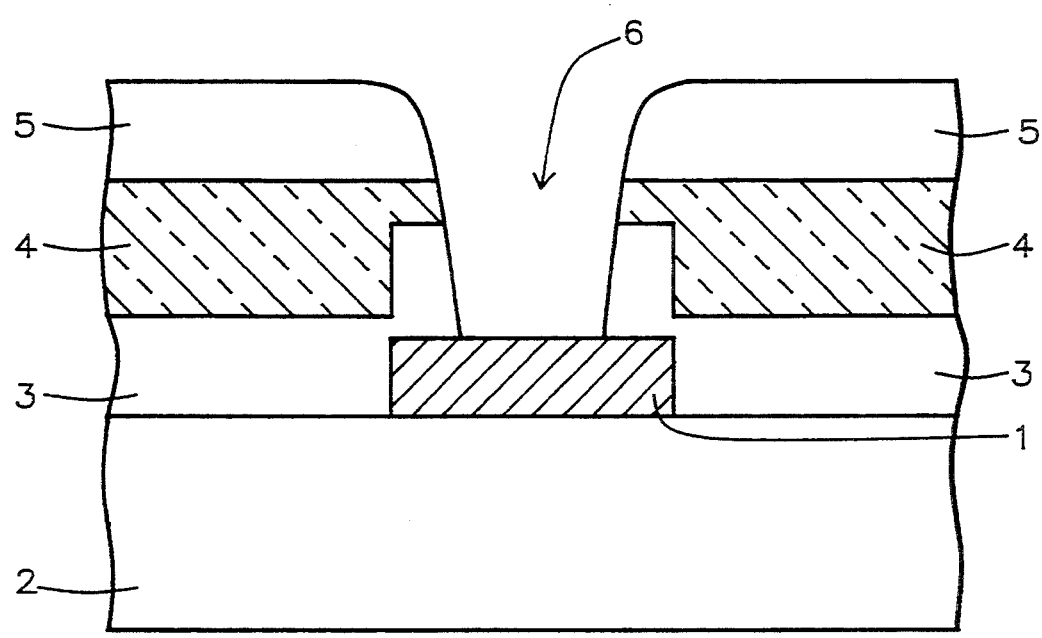
FIG. 2 illustrates how opening up a via hole in an integrated circuit can expose a layer of spin-on-glass that had previously been covered over.

After the optional etch back procedure, the next step in the manufacture of the integrated circuit would be to deposit an additional layer of insulating material onto the surface of the SOG. This is shown in FIG. 2 as insulating layer 5. At this stage, via holes need to be etched from the surface down to the level of metallic layer 1. An example of such a via hole is marked as 6 in FIG. 2. It will be seen that the surface of SOG layer 4 has now been exposed inside via hole 6.

Figure 3:
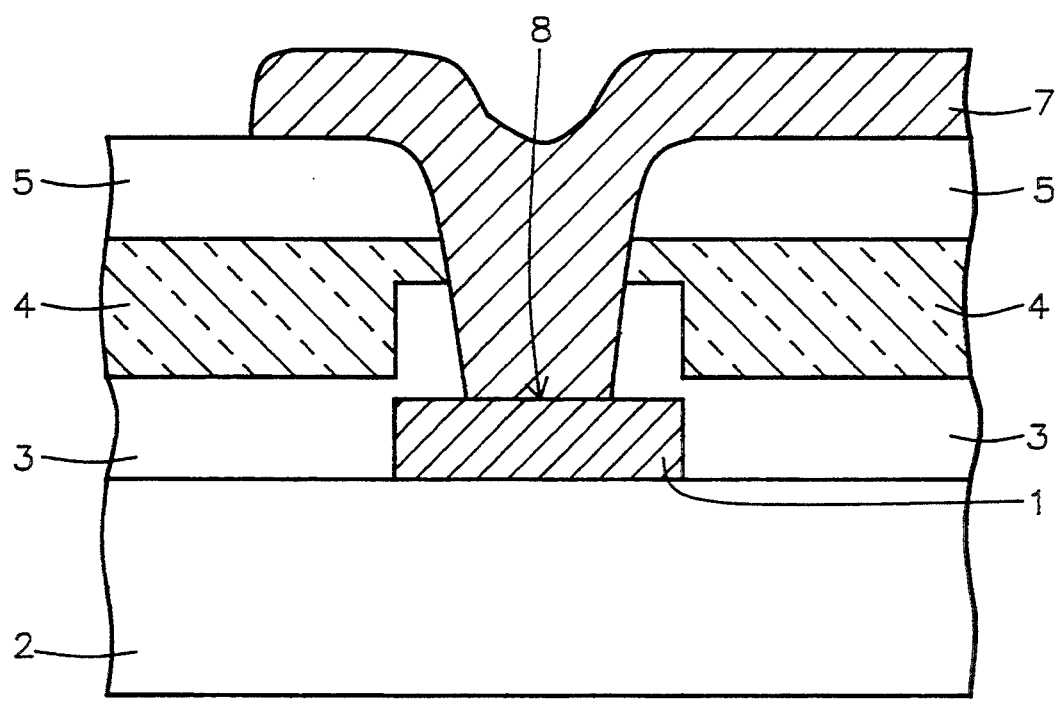
FIG. 3 is a cross-section of a metal layer that has been deposited onto the surface of an integrated circuit, including a via hole.

The next step in the manufacturing process would normally be the deposition of a second metal layer, shown as 7 in FIG. 3, for the purpose of making electrical contact between layers 1 and 7. There is, however, the possibility that the SOG surface that has been exposed inside the via hole will outgas during the process of laying down layer 7. This will lead to creation of a poorly conducting layer at the interface marked as 8 in FIG. 3, thus increasing the contact resistance between layers 1 and 7. In order to avoid this outgassing problem, the integrated circuit is heat treated in vacuum, just prior to the deposition of layer 7.

The temperature at which the outgassing treatment is performed is typically between 150° and 400° C. In general, it is good practice to subject an integrated circuit to temperatures of this magnitude for as short a time as possible, typically between 15 and 180 seconds. Thus, determination of the precise time, once heat treatment has started, at which degassing is essentially complete is of great importance. We have developed an effective means for accomplishing this as is shown in the following description of the preferred embodiment of the present invention.

Figure 4:
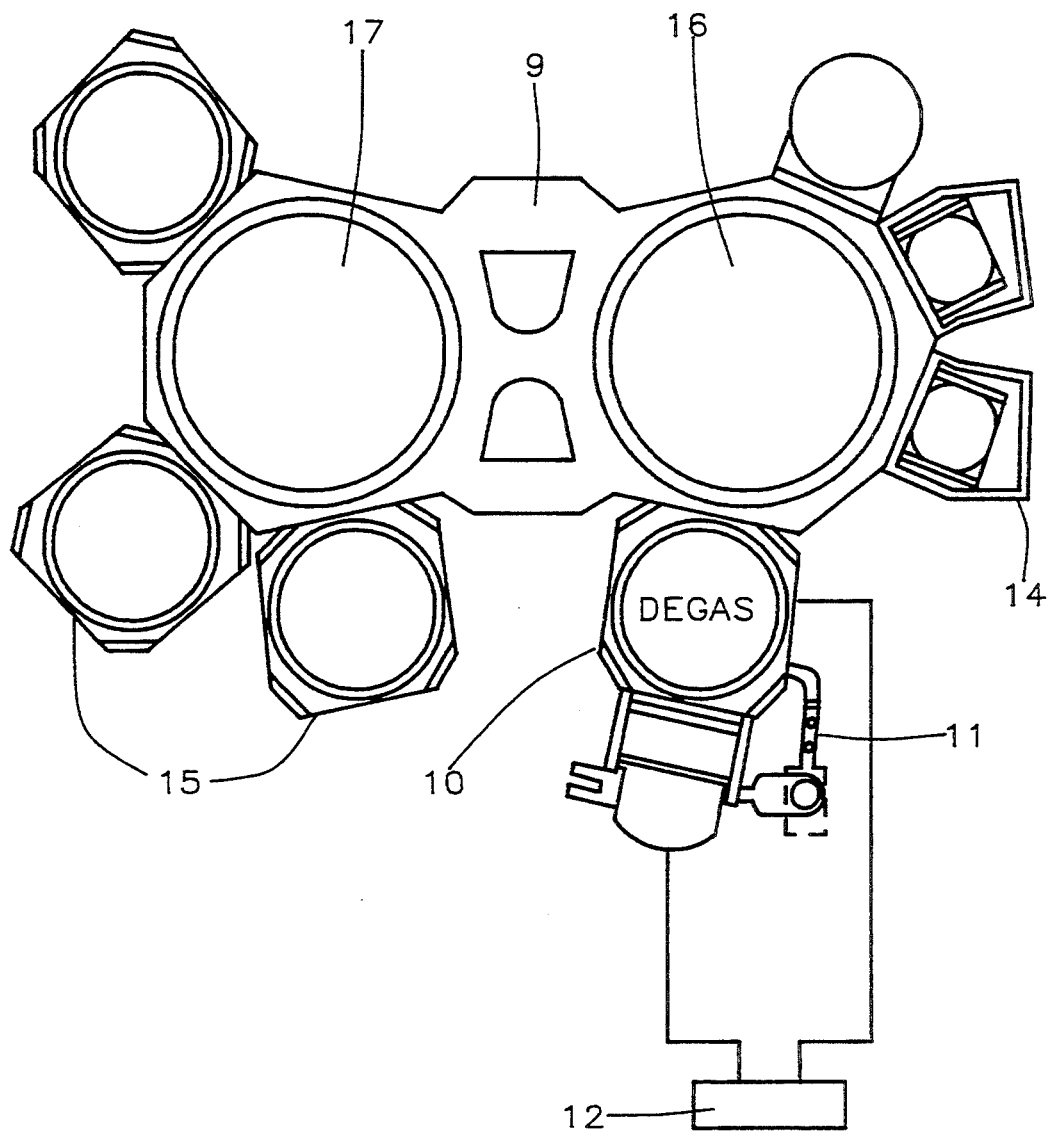
FIG. 4 is a plan view of a multi-chamber vacuum apparatus, including a chamber for vacuum outgassing that contains a residual gas analyzer and is connected to a control unit.

FIG. 4 shows a plan view of multi-chamber vacuum apparatus 9. To the two wafer transfer chambers 16 and 17 are attached a number of smaller chambers in which the actual operations of film deposition, vacuum heating etc. are performed. One such chamber is the one labelled 10. In this particular example it is used as the chamber for effecting the vacuum degassing of an exposed SOG layer (such as, for example, the one seen in the via hole 6 in FIG. 2). An important feature, which is key to the spirit of the present invention, is the residual gas analyzer 11 which is connected with and open to the chamber 10. In the present embodiment, a UTI Qualitorr Remote System (which is based on a quadrupole mass spectrometer) is used as the residual gas analyzer, but the invention is not dependent on any particular type or design of mass spectrometer for its successful operation.

In general, a quadrupole mass spectrometer is built around four conductive rods that are symmetrically distributed around a common axis. Pairs of opposing rods are connected to DC and RF voltage supplies. The gas that is to be analyzed is ionized by standard means in an area just ahead of the rods and then the ions are accelerated along the rods' common axis. For a given spacing between rod centers, the DC and RF voltages are chosen so as to allow ions of only a single mass (E/M ratio) to oscillate in stable orbits thereby reaching a collector located at the far end of the rods. The trajectories of all other ions are such that they spiral outwards and terminate at one of the rod surfaces. Ion mass resolution is increased by raising the RF frequency. Sensitivity is controlled by varying the ratio of DC to RF voltages. Detection of the ions is normally by means of electron multipliers.

Actual quadrupole mass spectrometers are typically about 30 cm. in length. Being open at both ends, they are well suited to applications such as the present invention and can be installed directly in line with the flow of gas through a vacuum system. The fact that they require no magnets for their operation helps to keep their overall size down, an important consideration for applications such as this one. Quadrupole mass spectrometers work best for relatively light ions, losing sensitivity for atomic mass units greater than a few hundred. This is of no importance with respect to the present invention where the ions being monitored have atomic masses less than one hundred.

Returning now to FIG. 4, the degassing of the exposed SOG layers is performed in chamber 10. While degassing is taking place, the partial pressure of the outgassed product (generally, but not necessarily only, water vapor) is monitored by the residual gas analyzer (RGA) 11. The output of 11 will rise initially as outgassing begins and then drop again once it is over. The output of RGA 11 is connected to control unit 12. When the output of 11 has fallen to some predetermined level, unit 12 will immediately terminate the outgas heat treatment in chamber 10 so that heat is not applied for any longer than necessary. At this point the normal integrated circuit manufacturing process can resume. Without breaking the vacuum, wafers are moved to chamber 14 (for example) for further processing and eventually to (for example) chambers 15 for sputter deposition of additional layers, and so on.

Figure 5:
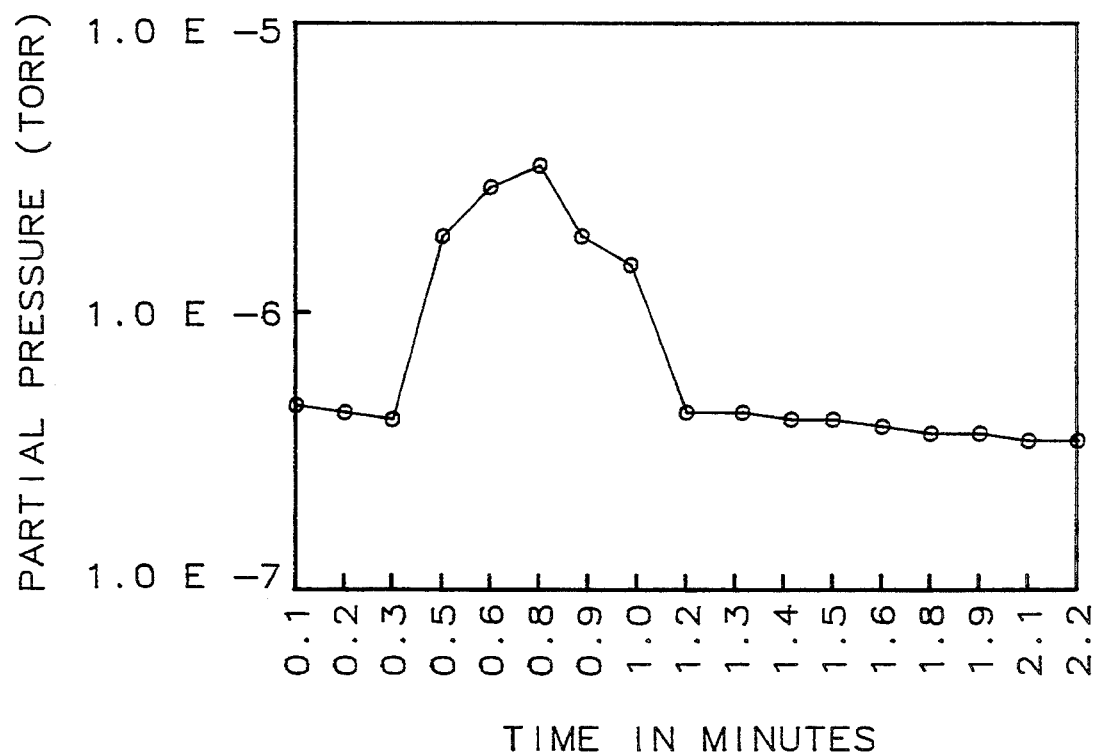
FIG. 5 is a curve relating the partial pressure of outgassed water vapor to time of heating in vacuum.

In FIG. 5 we show an example of a curve that was generated by the mass spectrometer during an actual degassing experiment. In this case, the integrated circuit was first vacuum baked at 250° C. for 30 minutes. It was then degassed at 375° C., starting at time zero in FIG. 5. In this case the mass spectrometer was set to measure the partial pressure of molecules having an atomic mass of 18, i.e. water vapor. As can be seen, there is a rise in the partial pressure of the water vapor beginning when the heat was applied. This peaks approximately 0.5 minutes after the start of the heat and then drops steadily. Approximately 1.1 minutes after the start of the heat, the partial pressure of the water vapor has dropped to a value of about $6 \times 10^{-7}$ torr, at which point the controller 12 in FIG. 4 was triggered and it then shut off the heat. After this, the temperature of the integrated circuit dropped rapidly, thus minimizing any undesired side-effects that might be associated with the heat treatment.

It should be noted that other, similar, embodiments of the present invention have also been used, with equal success. For example, the RGA was set to monitor atomic mass unit 17 (instead of 18, which is water vapor) so that it could measure the partial pressure of OH radicals that were formed as a result of the dissociation of some of the water molecules.

Figure 6:
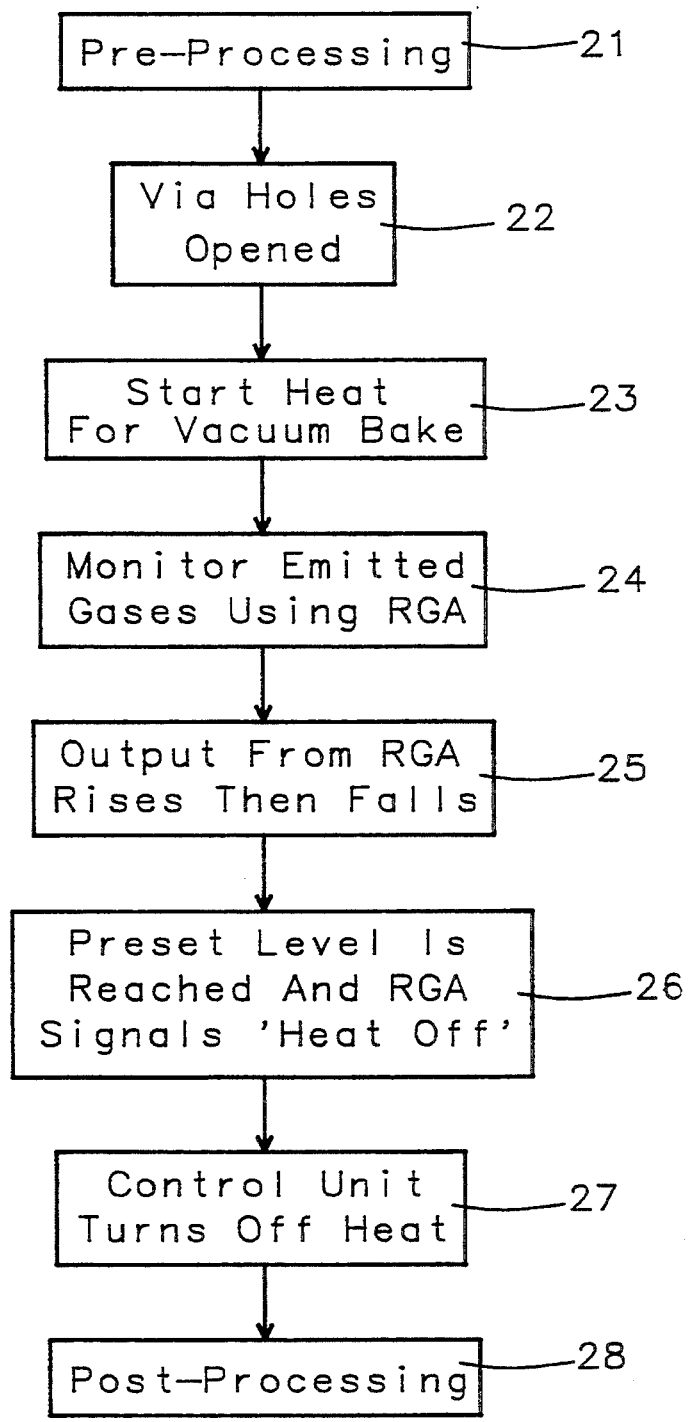
FIG. 6 is a flow chart summarizing the process steps that comprise the present invention.

FIG. 6 is a flow chart summarizing the entire process flow that constitutes the present invention. Step 21 includes all the various process steps, including the laying down of a layer of SOG for planarization purposes, that were performed prior to the point when it became necessary to open up via holes such as the one exemplified as 6 in FIG. 2. Step 22 reflects the actual process of etching via holes. In step 23 the outgassing of the exposed layers of SOG is started by initiating the application of heat to the integrated circuits under conditions of vacuum. Step 24 shows that the partial pressures of any gases that are emitted as a result of said vacuum heating are monitored by means of a residual gas analyzer (RGA), more particularly a quadrupole mass spectrometer.

In step 25 it is seen that the output from the RGA first rises (as gas is emitted from the integrated circuit) and then begins to fall (as outgassing goes to completion). Step 26 shows that, as the output of the RGA continues to fall, it will reach some preset level. Reaching this level serves to trigger a control unit which, in step 27, acts to turn off the heat in the vacuum chamber. Step 28 includes all the various processing steps that have yet to be performed to complete the manufacture of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. A method for optimizing the length of time for which a layer of a spin-on-glass is outgassed comprising:
   providing a vacuum chamber in which to heat said layer of spin-on-glass;
   providing means for heating and cooling said layer of spin-on-glass;
   providing a residual gas analyzer that shares the same atmosphere inside said vacuum chamber as said spin-on-glass;
   heating said layer of spin-on-glass for a period of time so as to cause the release of gases trapped on its surface and within its body thereby causing outgassing of the spin-on-glass layer;
   dynamically measuring the partial pressures of said released gases inside said vacuum chamber by means of said residual gas analyzer; and
   automatically terminating said outgas heat treatment as soon as the partial pressures of said released gases, as measured by said residual gas analyzer, falls below some level.

2. The method of claim 1 where the temperature at which the outgassing is performed is between 150° and 400° C.

3. The method of claim 1 where the time for which the outgassing is performed is between 15 and 180 seconds.

4. The method of claim 1 where the residual gas analyzer is a mass spectrometer.

5. The method of claim 1 where the residual gas analyzer is a quadrupole mass spectrometer.

6. The method of claim 1 where the residual gas analyzer is located inside the same chamber as the layer of spin-on-glass.

7. The method of claim 1 where the residual gas analyzer is located inside a chamber that is connected with, but is open to, the chamber which contains the layer of spin-on-glass.

8. The method of claim 1 where the residual gas analyzer measures the partial pressures of molecules having from 2 to 44 atomic mass units.

9. The method of claim 1 where the partial pressures that the residual gas analyzer measures are from $10^{-8}$ torr to $10^{-3}$ torr.

10. The method of claim 1 further comprising providing additional vacuum chambers containing layers of spin-on-glass and a plurality of residual gas analyzers, and said additional vacuum chambers and residual gas analyzers are all connected and open to one another and the vacuum chamber and the residual gas analyzer.

11. A method for optimizing the time needed to outgas via holes in integrated circuits, where a layer of spin-on-glass is among the layers that are exposed by the creation of said via hole, comprising:
   providing a layer of silicon dioxide on the surface of a silicon body;
   depositing a layer of a first conductive material onto the surface of said silicon dioxide;
   etching said layer of a first conductive material into a pattern;
   depositing a layer of a first insulating material onto said etched layer of conductive material;

depositing and curing a layer of spin-on-glass onto said first insulating layer thereby planarizing the surface;

depositing a layer of a second insulating material onto the surface of said layer of cured spin-on-glass;.

etching via holes from the resulting surface down to the level of said first layer of conductive material;

providing a vacuum chamber in which to heat said integrated circuit;

providing means for heating and cooling said integrated circuit;

providing a residual gas analyzer that shares the same atmosphere inside said vacuum chamber as said integrated circuit;

heating said integrated circuit for a period of time so as to cause the release of gases trapped within the via holes thereby causing outgassing of the spin-on-glass layer;

dynamically measuring the partial pressures of said released gases inside said vacuum chamber by means of said residual gas analyzer;

automatically terminating said outgas heat treatment as soon as the partial pressures of said released gases, as measured by said residual gas analyzer, falls below some level;

depositing a second layer of a conductive material onto the surface and into the via holes so as to make contact with said first layer of conductive material wherever said via holes have been etched; and etching said second layer of conductive material into a pattern.

12. The method of claim 11 where the temperature at which the outgassing is performed is between 150° and 400° C.

13. The method of claim 11 where the time for which the outgassing is performed is between 15 and 180 seconds.

14. The method of claim 11 where the residual gas analyzer is a mass spectrometer.

15. The method of claim 11 where the residual gas analyzer is a quadrupole mass spectrometer.

16. The method of claim 11 where the residual gas analyzer is located inside the same chamber as the integrated circuit.

17. The method of claim 11 where the residual gas analyzer is located inside a chamber that is connected with, but is open to, the chamber which contains the integrated circuit.

18. The method of claim 11 where the residual gas analyzer measures the partial pressures of molecules having from 2 to 44 atomic mass units.

19. The method of claim 11 where the partial pressures that the residual gas analyzer measures are from $10^{-8}$ torr to $10^{-3}$ torr.

20. The method of claim 11 further comprising providing additional vacuum chambers containing integrated circuits and a plurality of residual gas analyzers, and said additional vacuum chambers and residual gas analyzers are all connected and open to one another and the vacuum chamber and the residual gas analyzer.

* * * * *